(12) United States Patent
Anderson et al.

(10) Patent No.: US 7,898,065 B2
(45) Date of Patent: Mar. 1, 2011

(54) STRUCTURE AND METHOD FOR DEVICE-SPECIFIC FILL FOR IMPROVED ANNEAL UNIFORMITY

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/634,820

(22) Filed: Dec. 10, 2009

(65) Prior Publication Data

US 2010/0090320 A1    Apr. 15, 2010

Related U.S. Application Data

(62) Division of application No. 11/678,745, filed on Feb. 26, 2007, now Pat. No. 7,692,275.

(51) Int. Cl.
*H01L 23/58* (2006.01)

(52) U.S. Cl. ............... 257/629; 257/638; 257/257; 257/E21.444; 257/639; 257/438; 257/16; 257/640; 257/128; 257/752; 257/129; 257/754; 257/626; 257/758; 257/636; 257/762; 257/763; 257/765; 257/E21.214; 257/E21.295; 257/E21.304

(58) Field of Classification Search ............. 257/629, 257/638–640, 752, 754, 758, 762, 763, 765, 257/E21.096, E21.214, E21.237, E21.295, 257/E21.304, E21.444; 438/16, 128, 129, 438/626, 636

See application file for complete search history.

(56) References Cited

U.S. PATENT DOCUMENTS 4,525,380 A    6/1985    Arai et al.

(Continued)

FOREIGN PATENT DOCUMENTS

CN    1682358    10/2005

(Continued)

OTHER PUBLICATIONS

Anderson et al., U.S. Appl. No. 11/678,799, Notice of Allowance, Feb. 17, 2010, 4 pages.

(Continued)

*Primary Examiner*—Davienne Monbleau
*Assistant Examiner*—Farid Khan
(74) *Attorney, Agent, or Firm*—Gibb I.P. Law Firm, LLC; Richard M. Kotulak, Esq.

(57)    ABSTRACT

Disclosed are embodiments of a wafer that incorporates fill structures with varying configurations to provide uniform reflectance. Uniform reflectance is achieved by distributing across the wafer fill structures having different semiconductor materials such that approximately the same ratio and density between the different semiconductor materials is achieved within each region and, optimally, each sub-region. Alternatively, it is achieved by distributing across the wafer fill structures, including one or more hybrid fill structure containing varying proportions of different semiconductor materials, such that approximately the same ratio between the different semiconductor materials is achieved within each region and, optimally, each sub-region. Alternatively, it is achieved by distributing across the wafer fill structures having semiconductor materials with different thicknesses such that approximately the same overall ratio between the semiconductor material with the different thicknesses is achieved within each region and, optimally, each sub-region.

21 Claims, 10 Drawing Sheets

U.S. PATENT DOCUMENTS

| | | | |
|---|---|---|---|
| 5,523,262 | A | 6/1996 | Fair et al. |
| 5,841,110 | A | 11/1998 | Nenyei et al. |
| 5,897,381 | A | 4/1999 | Aronowitz et al. |
| 5,956,603 | A | 9/1999 | Talwar et al. |
| 6,262,435 | B1 * | 7/2001 | Plat et al. .................. 257/48 |
| 6,300,243 | B1 | 10/2001 | Thakur |
| 6,414,364 | B2 | 7/2002 | Lane et al. |
| 6,665,858 | B2 | 12/2003 | Miyazaki |
| 6,812,550 | B1 | 11/2004 | En et al. |
| 6,867,080 | B1 | 3/2005 | Paton et al. |
| 6,916,690 | B2 | 7/2005 | Chang |
| 7,344,929 | B2 | 3/2008 | Mehrotra et al. |
| 2004/0033666 | A1 | 2/2004 | Williams et al. |
| 2004/0077149 | A1 | 4/2004 | Renau |
| 2004/0084427 | A1 | 5/2004 | Talwar et al. |
| 2004/0188801 | A1 | 9/2004 | Ehrichs |
| 2004/0259387 | A1 | 12/2004 | Yamazaki et al. |
| 2005/0003638 | A1 | 1/2005 | Stolk |
| 2005/0009344 | A1 | 1/2005 | Hwang et al. |
| 2005/0085047 | A1 | 4/2005 | DeLoach et al. |
| 2005/0173802 | A1 * | 8/2005 | Tabara et al. ............ 257/758 |
| 2006/0099745 | A1 | 5/2006 | Hsu et al. |
| 2006/0154475 | A1 * | 7/2006 | Mehrotra et al. .......... 438/636 |
| 2006/0228897 | A1 | 10/2006 | Timans |

FOREIGN PATENT DOCUMENTS

| | | |
|---|---|---|
| DE | 10329212 | 1/2005 |
| JP | 06-295923 | 10/1994 |
| RU | 2206141 | 6/2003 |
| WO | 9319484 | 9/1993 |
| WO | 2007038575 | 4/2007 |

OTHER PUBLICATIONS

Anderson et al., U.S. Appl. No. 11/678,756, Notice of Allowance, Mar. 15, 2010, 3 pages.

Anderson et al., U.S. Appl. No. 12/719,153, Office Action Communication, Jul. 23, 2010, 15 pages.

Anderson et al., U.S. Appl. No. 11/678,799, Office Action Communication, Apr. 15, 2009, 19 pages.

Anderson et al., U.S. Appl. No. 11/678,783, Office Action Communication, Apr. 30, 2009, 12 pages.

Anderson et al., U.S. Appl. No. 11/869,768, Office Action Communication, May 14, 2009, 26 pages.

Anderson et al., U.S. Appl. No. 11/678,756, Office Action Communicationm Aug. 31, 2009, 6 pages.

PCT International Search Report and Written Opinion, Aug. 27, 2009, pp. 1-12.

Anderson et al., U.S. Appl. No. 11/678,799, Office Action Communication, Oct. 27, 2009, 15 pages.

Anderson et al., U.S. Appl. No. 11/869,768, Office Action Communication, Nov. 24, 2009, 18 pages.

Anderson et al., U.S. Appl. No. 11/678,745, Office Action Communication, May 13, 2009.

Anderson et al., U.S. Appl. No. 11/678,745, Notice of Allowance, Nov. 18, 2009, 10 pages.

* cited by examiner

STRUCTURE AND METHOD FOR DEVICE-SPECIFIC FILL FOR IMPROVED ANNEAL UNIFORMITY

BACKGROUND

1. Field of the Invention

The embodiments of the invention generally relate to semiconductor wafers, and, more particularly, to semiconductor wafer structures and methods of forming the structures that balance variations in reflectance and absorption characteristics.

2. Description of the Related Art

The fabrication of a semiconductor wafer typically involves the use of a rapid thermal anneal (RTA) process to affect the electrical properties of active devices on the wafer. Specifically, this RTA process can be used to activate dopants, diffuse dopants, reamporphize structures, repair damage from ion implantation processes, etc. RTAs are typically performed by powerful halogen lamp-based heating equipment which directs radiation onto a wafer surface, thereby, allowing fast changes in the temperature of the wafer. However, variations in the reflectance and absorption in different regions of the wafer can result in non-uniform temperature changes across the wafer (e.g., varying by 10° C. or more).

Variations in reflectance and absorption characteristics can be caused by different factors, such as different materials and/or different thicknesses of materials in different regions of the wafer. These non-uniform temperature changes can vary dopant activation, damage repair, etc. across the wafer and can, thereby, cause variations in threshold voltages, sheet resistances, drive currents, leakage currents, etc. Thus, non-uniform temperature changes can cause significant, location-dependent, variations in device performance.

Recently-developed complementary metal oxide semiconductor (CMOS) devices have incorporated epitaxially grown silicon germanium (eSiGe) into the source/drain regions of the p-type field effect transistors in order to enhance performance. Thus, these devices comprise both pfets with silicon germanium and n-type field effect transistors (nfets) with single crystalline silicon. However, the reflectance and absorption characteristics of silicon germanium and single crystalline silicon are different and can cause performance dispersion. Specifically, the reflectivity of eSiGe can be up to 10% higher than that of single crystalline silicon, thereby, causing a performance dispersion of up to 20%.

Similarly, hybrid orientation (HOT) wafers have been developed which silicon on insulator (SOI) sections having one orientation (e.g., 110) to enhance the performance of one type of field effect transistors (e.g., pfets) and bulk silicon sections having a different orientation (e.g., 100) to enhance the performance of another type of field effect transistor (e.g., nfets). However, because of their different thicknesses, the SOI and bulk silicon sections have different reflectance characteristics. Specifically, the reflectivity of the SOI sections can be up to 15% higher than the bulk silicon sections, thereby, causing a performance dispersion of up to 30%.

Furthermore, as technologies continue to scale, anneal ramp times will continue to decrease (e.g., to sub-second ramps) and these faster ramp times will be accompanied by an even greater sensitivity to variations in reflectance and absorption characteristics across a wafer.

SUMMARY

In view of the foregoing, disclosed herein are embodiments of a semiconductor structure and associated methods of forming the structure that use dummy fill structures with varying configurations to provide uniform reflectance (i.e., to balance reflectance and absorption characteristics, to ensure that reflectance and absorption characteristics are approximately equal, etc.) across a wafer in order to ensure uniform temperatures changes across the wafer during a rapid thermal anneal. One embodiment achieves uniform reflectance by distributing across the wafer fill structures that comprise different semiconductor materials such that approximately the same overall ratio and density between the different semiconductor materials is achieved within each region and, optimally, within each sub-region of the wafer. Another achieves uniform reflectance by distributing across the wafer fill structures, including one or more hybrid fill structure containing varying proportions of different semiconductor materials, such that approximately the same overall ratio and density between the different semiconductor materials is achieved within each region and, optimally, within each sub-region of the wafer. Yet another achieves uniform reflectance by distributing across the wafer fill structures that comprise semiconductor materials with different thicknesses such that approximately the same overall ratio and density between the semiconductor material with the different thicknesses is achieved within each region and, optimally, within each sub-region of the wafer.

More particularly, each embodiment of the semiconductor structure of the invention comprise a wafer with multiple regions from which individual dies will eventually be cut. Generally, each region will comprise an integrated circuit and will further comprise multiple sub-regions that contain the various different circuits of the integrated circuit. Each of these circuits can be made up of both first type devices (e.g., p-type field effect transistors (pfets)) and second type devices e.g., n-type field effect transistors (nfets)).

In the first two embodiments of the structure, the two different types of devices can comprise different materials that have different reflectance and absorption characteristics. These different materials can be selected for optimal field effect transistor performance. That is, each first device can comprise a first material with a first reflectivity (e.g., pfets with epitaxially grown silicon germanium in the source/drain regions). Similarly, each second device can comprise a second material with a second reflectivity (e.g., nfets with single crystalline silicon in the source/drain regions).

The first embodiment of the structure comprises fill structures (i.e., first fill structures and second fill structures). The first fill structures can comprise, for example, dummy first devices (i.e., non-functional devices that are structured in the same manner as the first devices such that they comprise the same first material (e.g., silicon germanium) as the first devices). Similarly, the second fill structures can comprise, for example, dummy second devices (i.e., non-functional devices that are structured in the same manner as the second devices such that they comprise the same second material (e.g., single crystalline silicon) as the second devices). To accomplish uniform reflectance (i.e., to balance reflectance and absorption characteristics, to provide approximately equal reflectance and absorption characteristics, etc.) across the wafer, the distribution of first and second fill structures from region to region on the wafer as well as from sub-region to sub-region within each region may vary depending upon the distribution of first and second devices.

More specifically, approximately uniform reflectance can be achieved when each region of the wafer and, optimally, when any given sub-region within each region has approximately the same overall ratio and density of different materials having different reflectivities. Since the ratio of first devices to second devices as well as their locations within any given region and/or within any given sub-region of the wafer will vary depending upon the design, the distribution (i.e., quantities and locations) of the first and second fill structures that is necessary to achieve uniform reflectance will also vary.

The second embodiment of the structure comprises at least one hybrid fill structure. Hybrid fill structures comprise both the first material (e.g., silicon germanium) and the second material (e.g., single crystalline silicon) in predetermined ratios. As with the previous embodiment, to accomplish uniform reflectance (i.e., to balance reflectance and absorption characteristics, to provide approximately equal reflectance and absorption characteristics, etc.), distribution of the fill structures across the wafer relative to the first and second devices is predetermined.

More specifically, approximately uniform reflectance can be achieved when each region of the wafer and, optimally, when any given sub-region within each region has approximately the same overall ratio and density of different materials having different reflectivities. Since the ratio of first to second devices as well as their locations within any given region and/or within any given sub-region of the wafer will vary depending upon the design, the distribution (i.e., the quantity and locations) of the fill structures (including at least one hybrid fill structure with a predetermined first material to second material ratio) that is necessary to achieve uniform reflectance may vary from region to region and sub-region to sub-region as may the ratio of first to second materials within any hybrid fill structures within those regions or sub-regions.

The third embodiment of the structure comprises a hybrid orientation wafer (HOT) wafer. The HOT wafer can comprise first sections with a first orientation (e.g., single crystalline silicon with a 110 orientation) and first thickness and second sections with a second orientation (e.g., single crystalline silicon with a 100 orientation) and second thickness. The first sections are positioned on the dielectric layer (i.e., silicon on insulator (SOI) sections). As a result of the different thicknesses of the first and second sections, the reflectance and absorption characteristics between the sections also vary. As with the previously described embodiments, each of the regions of HOT wafer in the third embodiment comprises an integrated circuit and further comprises multiple sub-regions that contain the various different circuits of the integrated circuit. Each of these circuits can be made up of both first type devices (e.g., p-type field effect transistors (pfets)) and second type devices (e.g., n-type field effect transistors (nfets)). However, in this embodiment instead of comprising different materials, the two different types of devices are formed in the different silicon sections of the HOT wafer and, thus, have different crystalline orientations of the same semiconductor material as well as different thicknesses and, therefore, different reflectance and absorption characteristics.

This third embodiment also comprises a plurality of fill structures (i.e., first and second fill structures). The first fill structures can comprise, for example, dummy first devices that have the same thickness and the same reflectivity as the first devices. Similarly, the second fill structures can comprise, for example, dummy second devices that have the same thickness and the same reflectivity as the second devices. To accomplish uniform reflectance (i.e., to balance reflectance and absorption characteristics, to provide approximately equal reflectance and absorption characteristics, etc.) across the wafer, the distribution of first and second fill structures from region to region on the wafer as well as from sub-region to sub-region within each region may vary depending upon the distribution of first and second devices.

More specifically, approximately uniform reflectance can be achieved when each region of the wafer and, optimally, when any given sub-region within each region has approximately the same overall ratio and density of materials having different thicknesses and, thus, different reflectivities. Since the ratio of first to second devices as well as their locations within any given region and/or within any given sub-region of the wafer will vary depending upon the design, the distribution (i.e., quantities and locations) of the first and second fill structures that is necessary to achieve uniform reflectance will also vary.

Also disclosed are methods of forming the above-described structures.

In the first embodiment of the method, a wafer is provided as is a design for an integrated circuit that is to be formed on the wafer. The integrated circuit design can comprise multiple circuits that incorporate both first type devices (e.g., p-type field effect transistors (pfets)) with a first material having a first reflectivity (e.g., epitaxially grown silicon germanium) and second type devices (e.g., n-type field effect transistors (nfets)) with a second material having a second reflectivity (e.g., single crystalline silicon). Based on the integrated circuit design, the first and second devices that will form the circuits are mapped onto the wafer. Then, based on the mapping of the first and second devices, the distribution of fill structures (i.e., of first and second fill structures) from region to region on the wafer as well as from sub-region to sub-region within each region is predetermined so that reflectance across the wafer will be approximately uniform.

More specifically, approximately uniform reflectance (i.e., balanced reflectance and absorption characteristics, approximately equal reflectance and absorption characteristics, etc.) can be achieved by distributing the fill structures so that each region of the wafer and, optimally, each sub-region within each region has approximately the same overall ratio and density of different materials having different reflectivities. Since the ratio of first devices to second devices as well as their locations within any given region and/or within any given sub-region of the wafer will vary depending upon the design, the distribution (i.e., quantities and locations) of the first and second fill structures that is necessary to achieve uniform reflectance will also vary.

Once the circuit is mapped and the locations and quantities of the fill structures are predetermined, the first and second devices and first and second fill structures are simultaneously formed on the wafer. Additionally, as the first devices are formed, the first fill structures can be formed, for example, by forming dummy first devices (i.e., non-functional devices) that are structured in the same manner as the first devices such that they comprise the same first material as the first devices. Similarly, as the second devices are formed, the second fill structures can be formed, for example, by forming dummy second devices (i.e., non-functional devices) that are structured in the same manner as the second devices such that they comprise the same second material as the second devices.

The second embodiment of the method similarly comprises providing a wafer and a design for an integrated circuit that is to be formed on the wafer. The integrated circuit design can comprise multiple circuits that incorporate both first type devices (e.g., p-type field effect transistors (pfets)) with a first material having a first reflectivity (e.g., epitaxially grown silicon germanium) and second type devices (e.g., n-type field effect transistors (nfets)) with a second material having a second reflectivity (e.g., single crystalline silicon). Based on the integrated circuit design, the first devices and second devices that will form the various circuits are mapped onto the wafer.

Then, based on the mapping of the first and second devices, fill structure composition and distribution from region to region on the wafer and from sub-region to sub-region within each region is predetermined so that reflectance across the wafer will be approximately uniform. The fill structures can comprises first fill structures comprising the first material, second fill structures comprising the second material, and/or one or more hybrid fill structures comprising both materials. Thus, determining fill structure composition and distribution comprises determining the distribution (i.e., quantity and locations) of first fill structures, determining the distribution (i.e., quantity and locations) of second fill structures and determining the distribution (i.e., quantity and locations) of different hybrid fill structures with different predetermined ratios of the first to second material.

More specifically, to achieve approximately uniform reflectance (i.e., balanced reflectance and absorption characteristics, approximately equal reflectance and absorption characteristics, etc.), distribution of the fill structures (including hybrid fill structures with predetermined ratios of first to second material) across the wafer relative to the first and second devices is predetermined so that each region of the wafer and, optimally, each sub-region within each region will have approximately the same overall ratio and density of different materials having different reflectivities. Since the ratio of first to second devices as well as their locations within any given region and/or within any given sub-region of the wafer will vary depending upon the design, the distribution (i.e., the quantity and locations) of the fill structures (including any hybrid fill structures) that is necessary to achieve uniform reflectance will be varied from region to region and sub-region to sub-region.

Once the circuit is mapped and once the configuration of the different fill structures as well as their respective locations and quantities are predetermined, the first and second devices and fill structures (including any hybrid fill structures) can simultaneously be formed on the wafer.

The third embodiment of the method comprises providing a hybrid orientation (HOT) wafer. The HOT wafer can be formed using conventional processing techniques such that first sections comprise 110 orientation single crystalline silicon that is optimal for pfet performance and the second sections comprise 100 orientation single crystalline silicon that is optimal for nfet performance. Due to the processes used to form the first and second sections, they will have different thicknesses. Consequently, the first and second sections will have different reflectance and absorption characteristics (i.e., a first reflectivity and a second reflectivity, respectively).

A design for an integrated circuit to be formed on the wafer is also provided. The integrated circuit design can incorporate both first type devices (e.g., p-type field effect transistors (pfets)) and second type devices (e.g., n-type field effect transistors (nfets)). Based on the integrated circuit design and the configuration of the HOT wafer, first devices and second devices are mapped onto the wafer. Specifically, the first and second devices are mapped so that they will be formed in the first and second sections, respectively, to ensure optimal performance. For example, if the first silicon sections are 110 orientation and the first devices are pfets, the first devices will be formed in the first sections to ensure optimal performance. Similarly, if the second silicon sections are 100 orientation and the second devices are nfets, the second devices will be formed in the second sections to ensure optimal performance.

Then, based on the mapping of the first and second devices, the distribution (i.e., quantity and locations) of fill structures (i.e., first and second fill structures) from region to region on the wafer as well as from sub-region to sub-region within each region is predetermined so that reflectance across the wafer will be approximately uniform (i.e., so that balance reflectance and absorption characteristics will be balanced, etc.). More specifically, approximately uniform reflectance can be achieved when each region of the wafer and, optimally, when any given sub-region within each region has approximately the same overall ratio and density of semiconductor material with a first thickness and first reflectivity to semiconductor material with a second thickness and second reflectivity. Since the ratio of first devices to second devices as well as their locations within any given region and/or within any given sub-region of the wafer will vary depending upon the design, the distribution (i.e., quantities and locations) of the first and second fill structures that is necessary to achieve uniform reflectance will also vary.

Once the circuit is mapped and the locations and quantities of the fill structures are predetermined, the first and second devices and first and second fill structures are simultaneously formed on the wafer. The first and second devices can be formed, for example, using conventional processing techniques for forming, on the same HOT wafer, pfets with in a first section with a first orientation (e.g., 110) silicon and nfets in a second section with a second orientation (e.g., 100) silicon. Additionally, as the first devices are formed, the first fill structures can be formed, for example, by forming dummy first devices (i.e., non-functional devices) that comprise the same orientation silicon with the same thickness. Similarly, as the second devices are formed, the second fill structures can be formed, for example, by forming dummy second devices (i.e., non-functional devices) that comprise the same orientation silicon with the same thickness.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
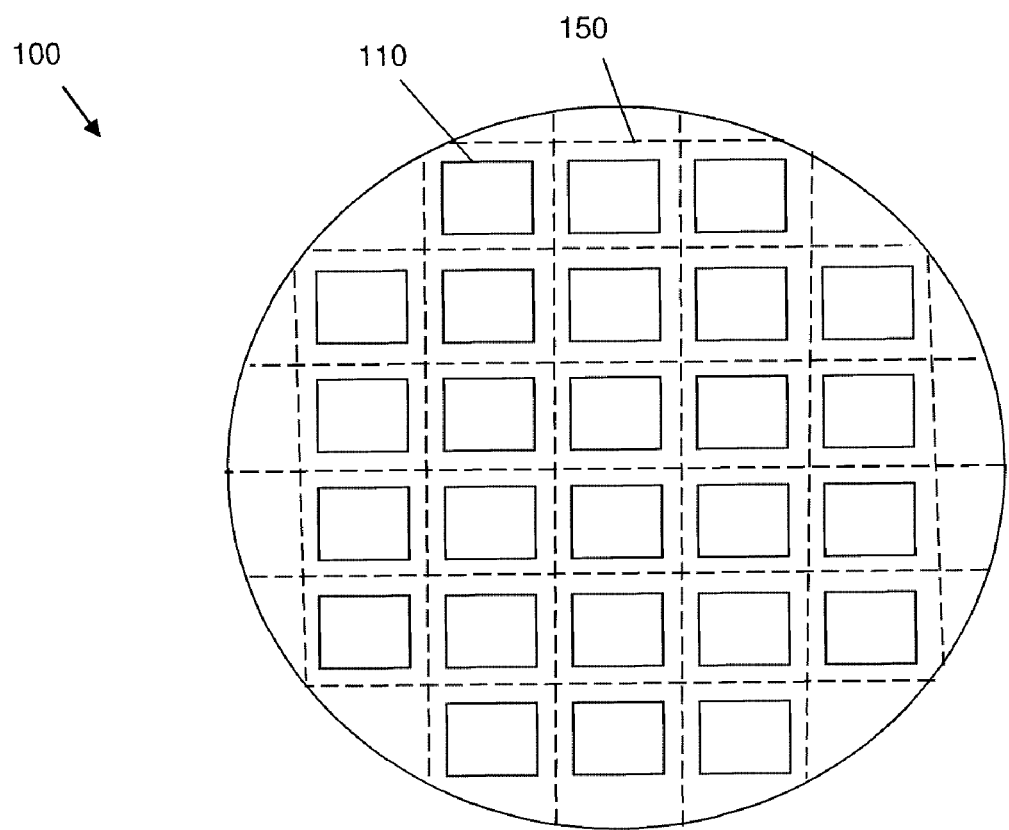
FIG. 1 is a schematic diagram illustrating an exemplary wafer.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, variations in reflectance and absorption characteristics can be caused by different factors, such as different material and/or different thicknesses of materials in different regions of the wafer. These non-uniform temperature changes can vary dopant activation, damage repair, etc. across the wafer and can, thereby, cause variations in threshold voltages, sheet resistances, drive currents, leakage currents, etc. Thus, non-uniform temperature changes can cause significant, location-dependent, variations in device performance.

Recently-developed complementary metal oxide semiconductor (CMOS) devices have incorporated epitaxially grown silicon germanium (eSiGe) into the source/drain regions of the p-type field effect transistors in order to enhance performance. Thus, these devices comprise both pfets with silicon germanium and n-type field effect transistors (nfets) with single crystalline silicon. However, the reflectance and absorption characteristics of silicon germanium and single crystalline silicon are different and can cause performance dispersion. Specifically, the reflectivity of eSiGe can be up to 10% higher than that of single crystalline silicon, thereby, causing a performance dispersion of up to 20%. Similarly, hybrid orientation (HOT) wafers have been developed which silicon on insulator (SOI) sections having one orientation (e.g., 110) to enhance the performance of one type of field effect transistors (e.g., pfets) and bulk silicon sections having a different orientation (e.g., 100) to enhance the performance of another type of field effect transistor (e.g., nfets). However, because of their different thicknesses, the SOI and bulk silicon sections have different reflectance characteristics. Specifically, the reflectivity of the SOI sections can be up to 15% higher than the bulk silicon sections, thereby, causing a performance dispersion of up to 30%. Furthermore, as technologies continue to scale, anneal ramp times will continue to decrease (e.g., to sub-second ramps) and these faster ramp times will be accompanied by an even greater sensitivity to variations in reflectance and absorption characteristics across a wafer. Thus, there is a need in the art for a semiconductor wafer structure and an associated technique that ensures uniform temperature changes across the wafer during a rapid thermal anneal process.

In view of the foregoing, disclosed herein are embodiments of a semiconductor structure and associated methods of forming the structure that use dummy fill structures with varying configurations to provide uniform reflectance (i.e., to balance reflectance and absorption characteristics, to provide approximately equal reflectance and absorption characteristics, etc.) across a wafer in order to ensure uniform temperatures changes across the wafer during a rapid thermal anneal. One embodiment achieves uniform reflectance by distributing across the wafer fill structures that comprise different semiconductor materials such that approximately the same overall ratio and density between the different semiconductor materials is achieved within each region and, optimally, within each sub-region of the wafer. Another achieves uniform reflectance by distributing across the wafer fill structures, including one or more hybrid fill structure containing varying proportions of different semiconductor materials, such that approximately the same overall ratio and density between the different semiconductor materials is achieved within each region and, optimally, within each sub-region of the wafer. Yet another achieves uniform reflectance by distributing across the wafer fill structures that comprise semiconductor materials with different thicknesses such that approximately the same overall ratio and density between the semiconductor material with the different thicknesses is achieved within each region and, optimally, within each sub-region of the wafer.

More particularly, referring to FIG. 1, each embodiment of the semiconductor structure of the invention comprise a wafer 100 with multiple regions 110 from which individual dies will eventually be cut. These regions 101 can, for example, be separated by scribe lines 150.

Figure 2:
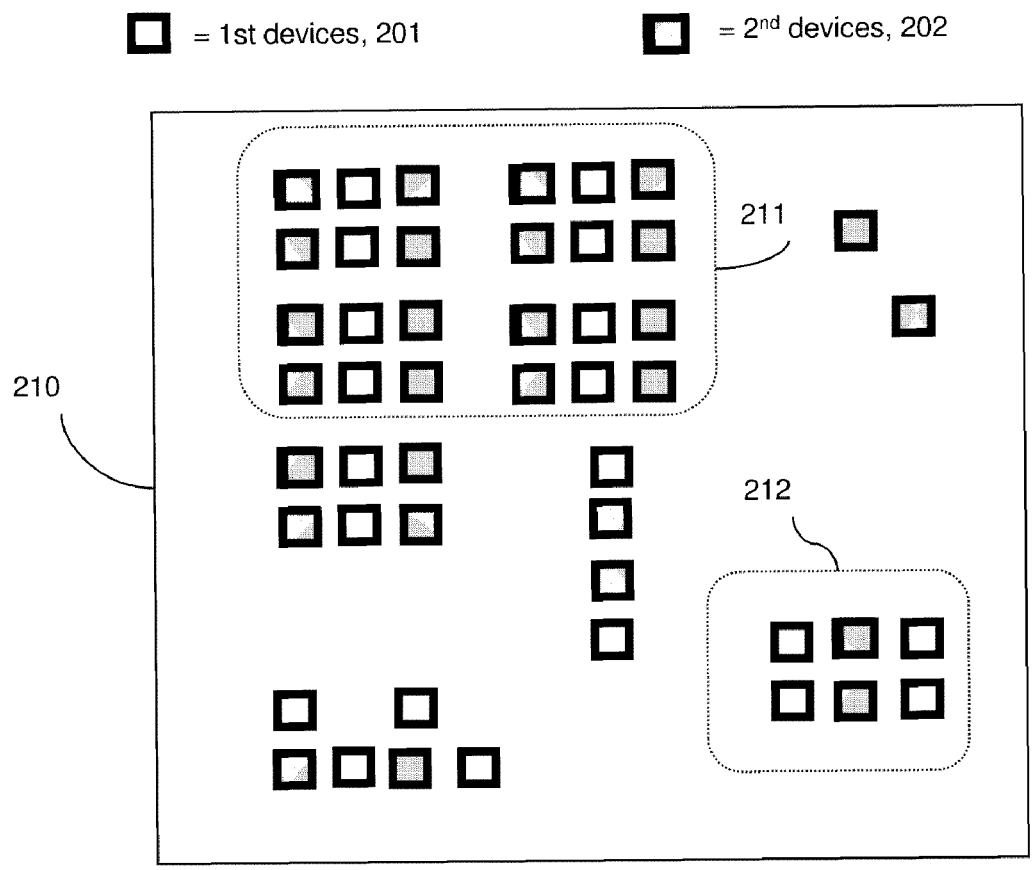
FIG. 2 is a schematic diagram illustrating an exemplary integrated circuit.

FIG. 2 illustrates an exploded view of a region 210 of a wafer structure as in FIG. 1. Generally, each region will comprise an integrated circuit and will further comprise multiple sub-regions (e.g., 211, 212) that contain the various different circuits (e.g., static random access memories (SRAMs), logic circuits, etc.) of the integrated circuit. Each of these circuits can be made up of individual devices, for example, complementary metal oxide semiconductor (CMOS) devices that incorporate both first type devices 201 (e.g., p-type field effect transistors (pfets)) and second type devices 202 (e.g., n-type field effect transistors (nfets)).

Figure 3:
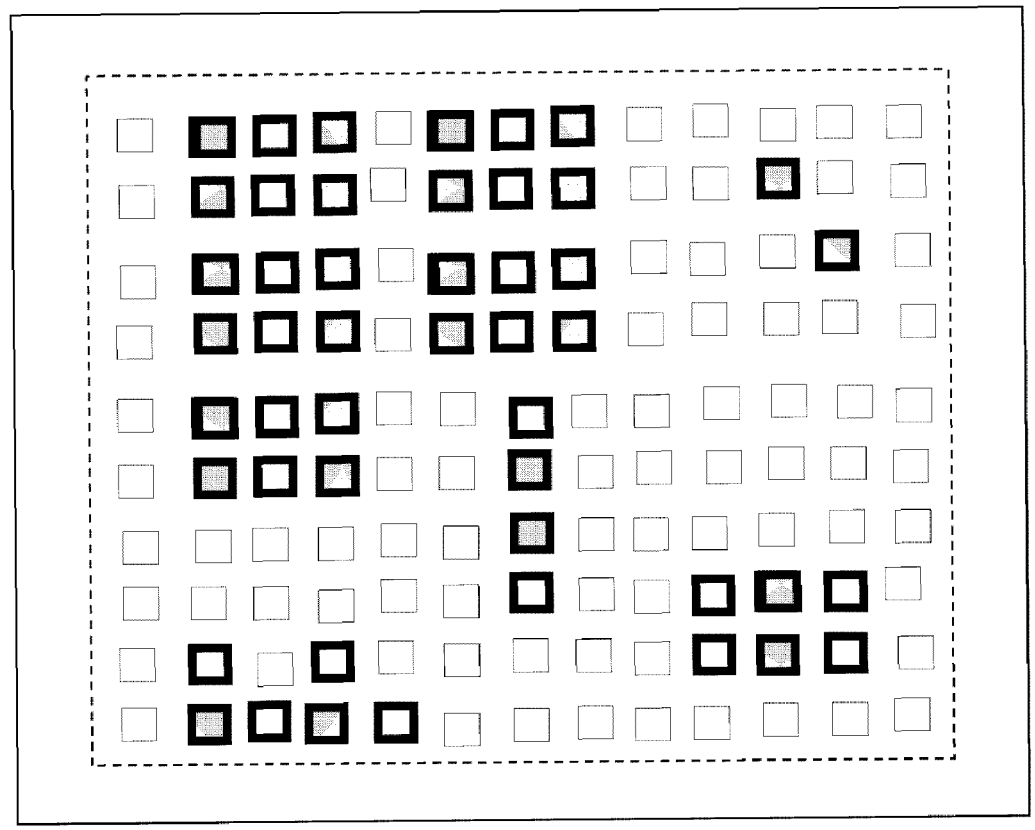
FIG. 3 is a schematic diagram illustrating fill structures incorporated into a wafer structure.

FIG. 3 illustrates an exploded view of a region 310 of a wafer structure as in FIG. 1. In the past dummy fill structures 300 have been incorporated into the wafer are the various circuits (i.e., around first devices 301 and second devices 302) in order to uniformly distribute the device density across the wafer and, thereby, reduce variations in etch bias and slope profile of structures formed at various locations across the wafer (e.g., as illustrated in U.S. Pat. No. 6,262,435 issued to Plat et al., on Jul. 17, 2001 and incorporated herein by reference). These dummy fill structures 300 are typically all of the same type (i.e., made from the same materials, same thicknesses and configured in the same manner).

Contrarily, the embodiments of the present invention use multiple different dummy fill structures with varying different materials, thickness and/or configurations, not only to uniformly distribute device density, but also to uniformly distribute reflectance and absorption characteristics across the wafer and thereby, ensure uniform temperature changes during rapid thermal anneal processing.

Figure 4:
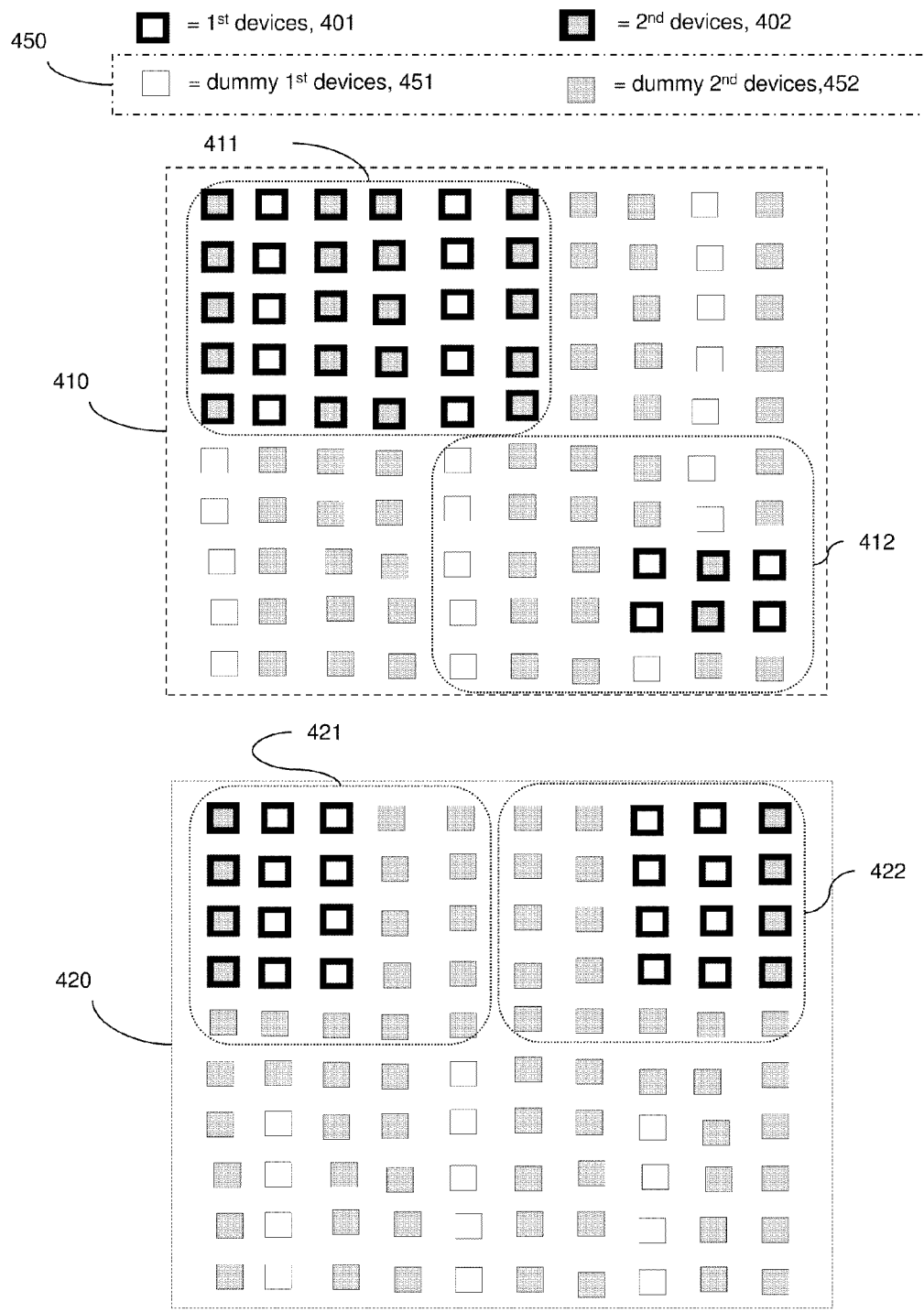
FIG. 4 is a schematic diagram illustrating an embodiment of the structure of the invention.
Figure 5:
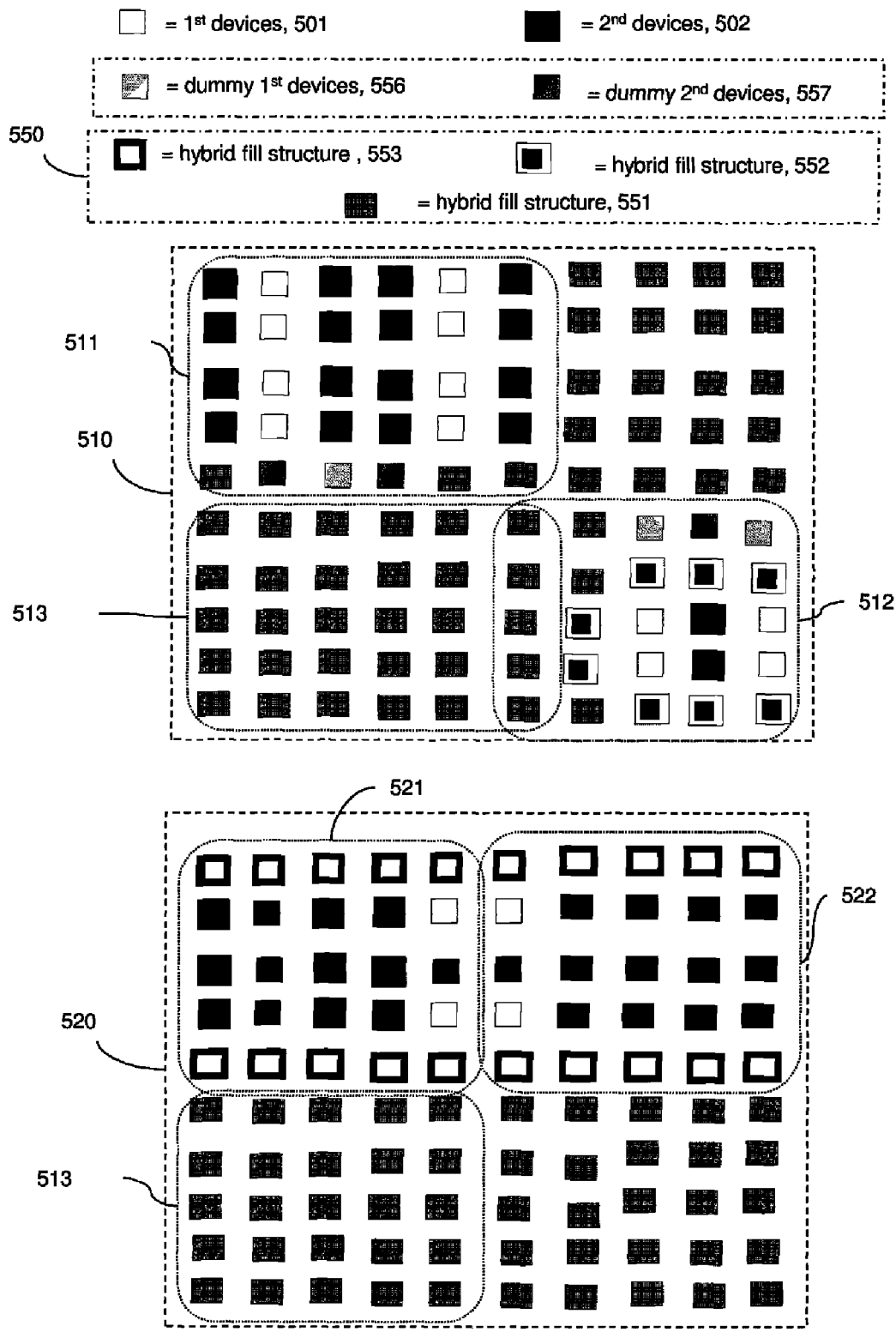
FIG. 5 is a schematic diagram illustrating another embodiment of the structure of the invention.

Referring to FIGS. 4 and 5, in the first two embodiments of the structure, the two different types of devices (e.g., 401-402 of FIGS. 4 and 501-502 of FIG. 5) can comprise different materials that have different reflectance and absorption characteristics. These different materials can be selected for optimal field effect transistor performance. More specifically, each first device 401, 501 can comprise a first material with a first reflectivity (e.g., pfets with epitaxially grown silicon germanium in the source/drain regions). Similarly, each second device 402, 502 can comprise a second material with a second reflectivity (e.g., nfets with single crystalline silicon in the source/drain regions).

FIG. 4 illustrates an exploded view of two adjacent regions 410, 420 of a wafer structure as in FIG. 1. In this first embodiment, the fill structures 450 can comprise both first fill structures 451 and second fill structures 452. The first fill structures 451 can comprise, for example, dummy first devices (i.e., non-functional devices that are structured in the same manner as the first devices 401 such that they comprise the same first material (e.g., silicon germanium) as the first devices 401). Similarly, the second fill structures 452 can comprise, for example, dummy second devices (i.e., non-functional devices that are structured in the same manner as the second devices 402 such that they comprise the same second material (e.g., single crystalline silicon) as the second devices 402).

To accomplish uniform reflectance (i.e., to balance reflectance and absorption characteristics, to provide approximately equal reflectance and absorption characteristics, etc.) across the wafer, the distribution of first and second fill structures 451, 452 from region to region on the wafer as well as from sub-region to sub-region within each region may vary depending upon the distribution of first and second devices 401, 402. More specifically, approximately uniform reflectance can be achieved when each region 410, 420 of the wafer and, optimally, when any given sub-region within each region (e.g., sub-regions 411-412 of region 410, sub-regions 421-422 of region 420, etc.) has approximately the same overall ratio and density of different materials having different reflectivities. That is, each region 410, 420 and, optimally, each sub-region has approximately the same overall ratio between the sum of the surface area of the first material in the first devices and first fill structures to the sum of the surface area of the second material in the second devices and second fill structures. This same overall ratio can be predetermined and can, for example, be based on a ratio of all of the first devices 401 on the wafer to all of the second devices 402 on the wafer.

Thus, for illustration purposes only, if the wafer design includes one hundred first devices and three hundred second devices, the predetermined ratio of first to second materials for each region 410, 420 should be approximately 1:3. However, since the ratio of first devices to second devices as well as their locations within any given region and/or within any given sub-region of the wafer will vary depending upon the design, the distribution (i.e., quantities and locations) of the first and second fill structures 451, 452 that is necessary to achieve uniform reflectance will also vary.

For example, regions 410 and 420 each illustrate an approximately 1:3 ratio of the first to second materials (i.e., the ratio of the sum of the surface area of the first material in the first devices and first fill structures to the sum of the surface area of the second material in the second devices and second fill structures). However, because the circuits in sub-regions 411-412 of region 410 and in sub-regions 421-422 of region 420 are different (i.e., they contain different numbers and/or configurations of first and second devices 401, 402), the distribution of the first and second fill structures 451, 452 varies between regions 410 and 420. Additionally, because different sub-regions have different ratios of first to second devices, the distribution of the first and second fill structures 451, 452 between the different sub-regions may also vary.

FIG. 5 illustrates an exploded view of two adjacent regions 510, 520 of a wafer structure as in FIG. 1. In this second embodiment one, some or all of the fill structures can comprise hybrid fill structures 550. Hybrid fill structures 550 are fill structures that comprise both the first material (e.g., silicon germanium) and the second material (e.g., single crystalline silicon). To accomplish uniform reflectance (i.e., to balance reflectance and absorption characteristics, to provide approximately equal reflectance and absorption characteristics, etc.), distribution of the fill structures (including first fill structures 556 comprising the first material, second fill structures 557 comprising the second material and/or one or more hybrid structures 550) across the wafer relative to the first and second devices 501, 502 is predetermined.

More specifically, approximately uniform reflectance can be achieved when each region 510, 520 of the wafer and, optimally, when any given sub-region within each region (e.g., sub-regions 511-513 of region 510, sub-regions 521-523 of region 520, etc.) has approximately the same overall ratio and density of different materials having different reflectivities. That is, each region 510, 520 and, optimally, each sub-region can have approximately the same overall ratio between the sum of the surface area of the first material in the first devices 501, the surface area of the first material in any first fill structures 556 and the surface area of the first material in any hybrid fill structures 550 to the sum of the surface area of the second material in the second devices 502, the surface area of the second material in any second fill structures 557 and the surface area of the second material in any hybrid fill structures 550. As with the previously described embodiment, this same overall ratio can be predetermined and can, for example, be based on a ratio of all of the first devices 501 on the wafer to all of the second devices 502 on the wafer.

Thus, for illustration purposes only, if the wafer design includes one hundred first devices and three hundred second devices, the predetermined ratio of first to second materials for each region 510, 520 should be approximately 1:3. However, since the ratio of first to second devices as well as their locations within any given region and/or within any given sub-region of the wafer will vary depending upon the design, the distribution (i.e., the quantity and locations) of the fill structures, including any hybrid fill structures 550, that is necessary to achieve uniform reflectance may vary from region to region and sub-region to sub-region as will the ratio of first to second materials within any of the hybrid structures 550.

For example, regions 510 and 520 each illustrate an approximately 1:3 ratio of first to second materials (i.e., the ratio of the sum of the surface area of the first material in the first devices 510, in any first dummy devices 556 and in any hybrid fill structures 550 to the sum of the surface area of the second material in the second devices 502, in any second dummy devices 557 and in any hybrid fill structures 550). However, because the circuits in sub-regions 511-512 of the region 510 and the circuits in sub-regions 521-522 of region 520 are different (i.e., they contain different numbers and/or configurations of first and second devices 501, 502), the distribution of the fill structures 556, 557 and 550 as well as the ratio of first to second materials within any of the hybrid fill structures 550 may vary. That is, first fill structures 556, second fill structures 557 and/or one or more of hybrid fill structures 550 having different ratios of first to second materials (e.g., see hybrid fill structures 551-552) can be formed on the wafer to ensure uniform reflectance.

For example, in less dense sub-regions (e.g., sub-regions 513 of region 510 and 523 of region 520) or in sub-regions already exhibiting the predetermined ratio of first to second materials (e.g., sub-region 511 of region 520), a first hybrid fill structure 551 that comprises the same ratio of first to second materials as the predetermined ratio for each region (e.g., 1:3) and/or first and second dummy devices 556, 557 in that same predetermined ratio can be used. However, in sub-regions in which the ratio of first to second devices is greater than or less than the predetermined ratio for each region, additional hybrid fill structures (e.g. 552-553) and/or different ratios of first to second dummy devices 556, 557 can be used. For example, in sub-region 512 of region 510 a greater ratio of first to second devices can be balanced by second hybrid fill structures 552 having a greater amount of the second material proportionally as compared to the first hybrid fill structures 551. Alternatively, in sub-regions 521-522 of region 520 a lesser ratio of first to second devices can be balanced by third hybrid fill structures 553 having a lesser amount of the second material proportionally than the first hybrid fill structures 551.

Figure 6:
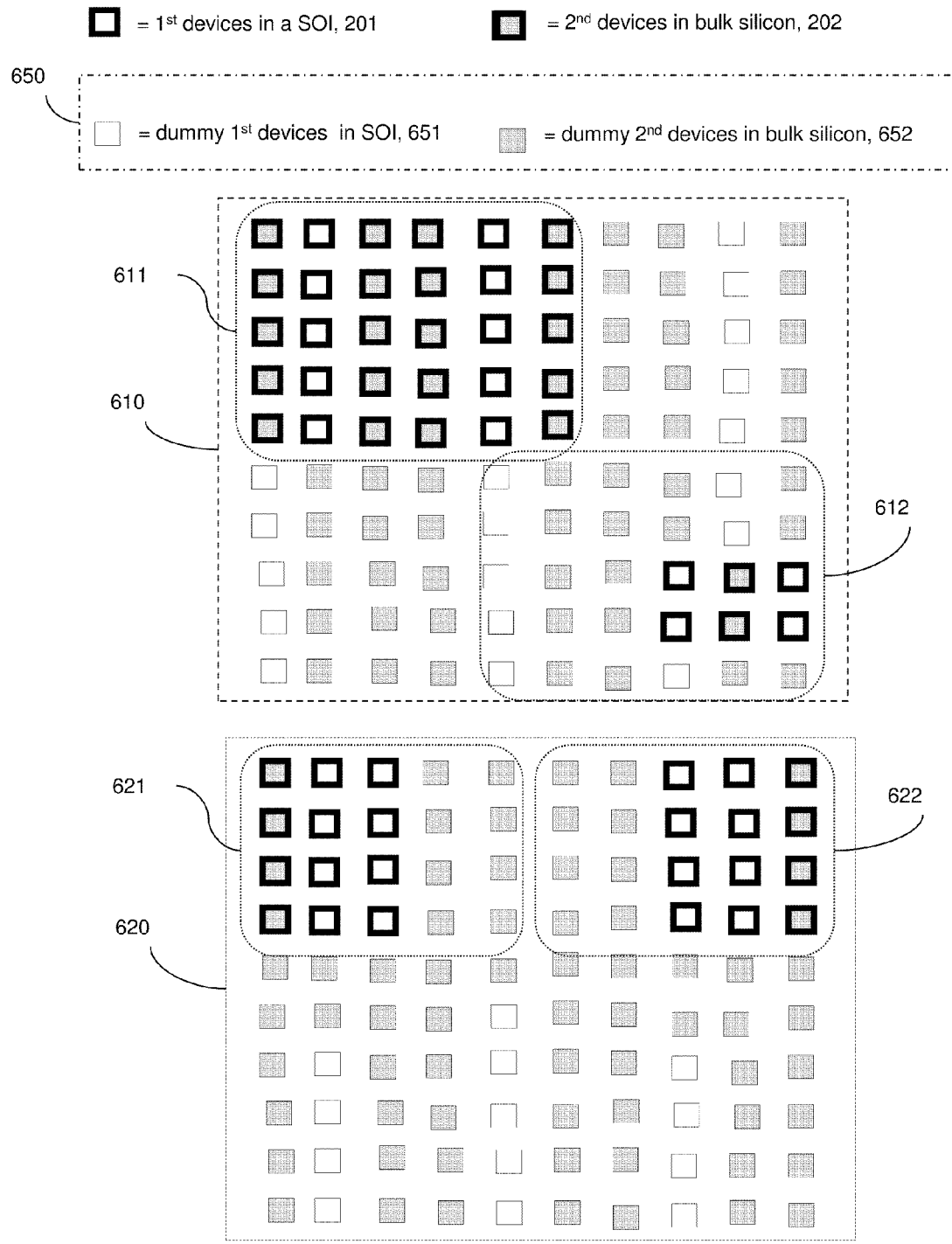
FIG. 6 is a schematic diagram illustrating yet another embodiment of the structure of the invention.
Figure 7:
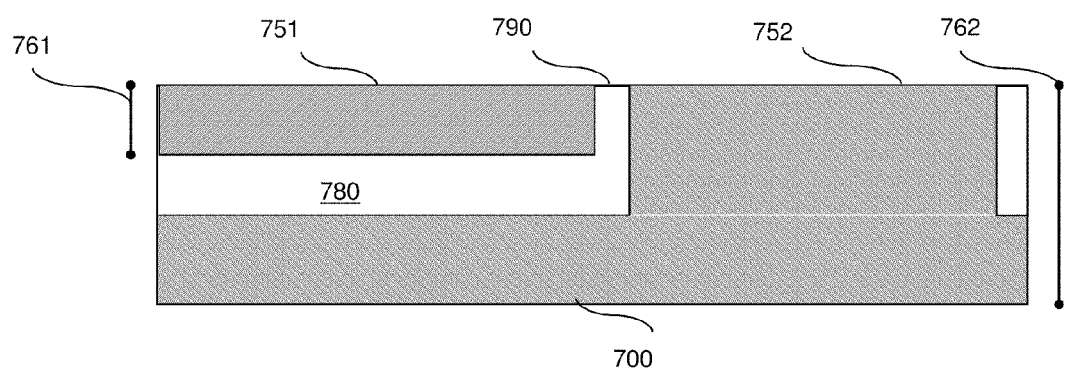
FIG. 7 is a schematic diagram illustrating an exemplary hybrid orientation (HOT) wafer.

FIG. 6 illustrates an exploded view of two adjacent regions 610, 620 of a wafer structure as in FIG. 1. In this third embodiment of the structure, the wafer 100 specifically comprises a hybrid orientation wafer (HOT) wafer. As illustrated in FIG. 7, the HOT wafer has sections of semiconductor material with different orientations (i.e., first and second section 751, 752) that are isolated from each other by a dielectric layer 780 and isolation structures 790. That is, the HOT wafer can comprise first sections 751 with a first orientation (e.g., single crystalline silicon with a 110 orientation) and second sections 752 with a second orientation (e.g., single crystalline silicon with a 100 orientation). The first sections 751 are positioned on the dielectric layer 780 (i.e., silicon on insulator (SOI) sections). The second sections 752 are positioned adjacent to the first sections 751 and are separated therefrom by isolations structures 790. The second sections 752 (i.e., bulk silicon sections) further extend into the dielectric layer 780 and/or through the dielectric layer 780 to a semiconductor substrate. Thus, the first and second sections 751-752 have different orientations and different thicknesses (e.g., 761 and 762, respectively). As a result of the different thicknesses of the SOI and bulk sections, the reflectance and absorption characteristics between the sections 751-752 also vary (i.e., the first sections 751 have a first reflectivity and the second sections 752 have a second reflectivity).

Referring to FIGS. 6 and 7 in combination, as with the previously described embodiments, each of the region (e.g., 610, 620) of wafer comprises an integrated circuit. Generally, each region 610, 620 will comprise an integrated circuit and will further comprise multiple sub-regions (e.g., 611-612 of region 610, 621-622 of region 620, etc.) that contain the various different circuits (e.g., static random access memories (SRAMs), logic circuits, etc.) of the integrated circuit. Each of these circuits can be made up of individual devices, for example, complementary metal oxide semiconductor (CMOS) devices that incorporate both first type devices 601 (e.g., p-type field effect transistors (pfets)) and second type devices 602 (e.g., n-type field effect transistors (nfets)). However, in this embodiment instead of comprising different materials, the two different types of devices 601, 602 are formed in the different silicon sections of the HOT wafer and, thus, have different crystalline orientations of the same semiconductor material as well as different thicknesses and, therefore, different reflectance and absorption characteristics. For example, the first devices 601 can be formed in the first sections 751 of the HOT wafer, can have a first thickness 761 and can comprise pfets with a 110 orientation silicon for optimal performance and the second devices 602 can be formed in the second silicon sections 752, can have a second thickness 762 and can comprise nfets with a 100 orientation silicon for optimal performance.

As with the previously described embodiments, each of the regions 610, 620 of the wafer can also comprise a plurality of fill structures 650 that are positioned adjacent to the first and second devices 601, 602 of the integrated circuit. In this embodiment the fill structures 650 can comprise both first fill structures 651 and second fill structures 652. The first fill structures 651 can comprise, for example, dummy first devices (i.e., non-functional devices that are formed in the same manner as the first devices in the first sections 751 of the HOT wafer such that they have the same thickness 761 and, thus, the same reflectivity as the first devices 601). Similarly, the second fill structures 652 can comprise, for example, dummy second devices (i.e., non-functional devices that are structured in the same manner as the second devices 602 in the second sections 752 of the HOT such that they have the same thickness 762 and, thus, the same reflectivity as the second devices 602).

To accomplish uniform reflectance (i.e., to balance reflectance and absorption characteristics, to provide approximately equal reflectance and absorption characteristics, etc.) across the wafer, the distribution of first and second fill structures 651, 652 from region to region on the wafer as well as from sub-region to sub-region within each region may vary depending upon the distribution of first and second devices 601, 602. More specifically, approximately uniform reflectance can be achieved when each region 610, 620 of the wafer and, optimally, when any given sub-region within each region (e.g., sub-regions 611-612 of region 610, sub-regions 621-622 of region 620, etc.) has approximately the same overall ratio and density of materials having different thicknesses and, thus different reflectivities. That is, each region 610, 620 and, optimally, each sub-region has approximately the same overall ratio between the sum of the surface area of the semiconductor material with the first thickness 761 in the first devices 601 and first fill structures 651 to the sum of the surface area of the semiconductor material with the second thickness 762 in the second devices 602 and second fill structures 652. This same overall ratio can be predetermined and can, for example, be based on a ratio of all of the first devices 601 on the wafer to all of the second devices 602 on the wafer. Thus, for illustration purposes only, if the wafer design includes one hundred first devices and three hundred second devices, the predetermined ratio of first to second materials for each region 610, 620 should be approximately 1:3. However, since the ratio of first devices to second devices as well as their locations within any given region and/or within any given sub-region of the wafer will vary depending upon the design, the distribution (i.e., quantities and locations) of the first and second fill structures 651, 652 that is necessary to achieve uniform reflectance will also vary.

For example, regions 610 and 620 each illustrate an approximately 1:3 ratio semiconductor material with the first thickness to semiconductor material with the second thickness (i.e., the ratio of the sum of the surface area of the semiconductor material with the first thickness 761 in the first devices 601 and first fill structures 651 to the sum of the surface area of the semiconductor material with the second thickness 762 in the second devices 602 and second fill structures 652). However, because the circuits in sub-regions 611-612 of region 610 and in sub-regions 621-622 of region 420 are different (i.e., they contain different numbers and/or configurations of first and second devices 601, 602), the distribution of the first and second fill structures 651, 652 varies between regions 610 and 620. Additionally, because different sub-regions have different ratios of first to second devices, the distribution of the first and second fill structures 651, 652 between the different sub-regions may also vary.

Also disclosed are methods of forming the above-described structures.

Figure 8:
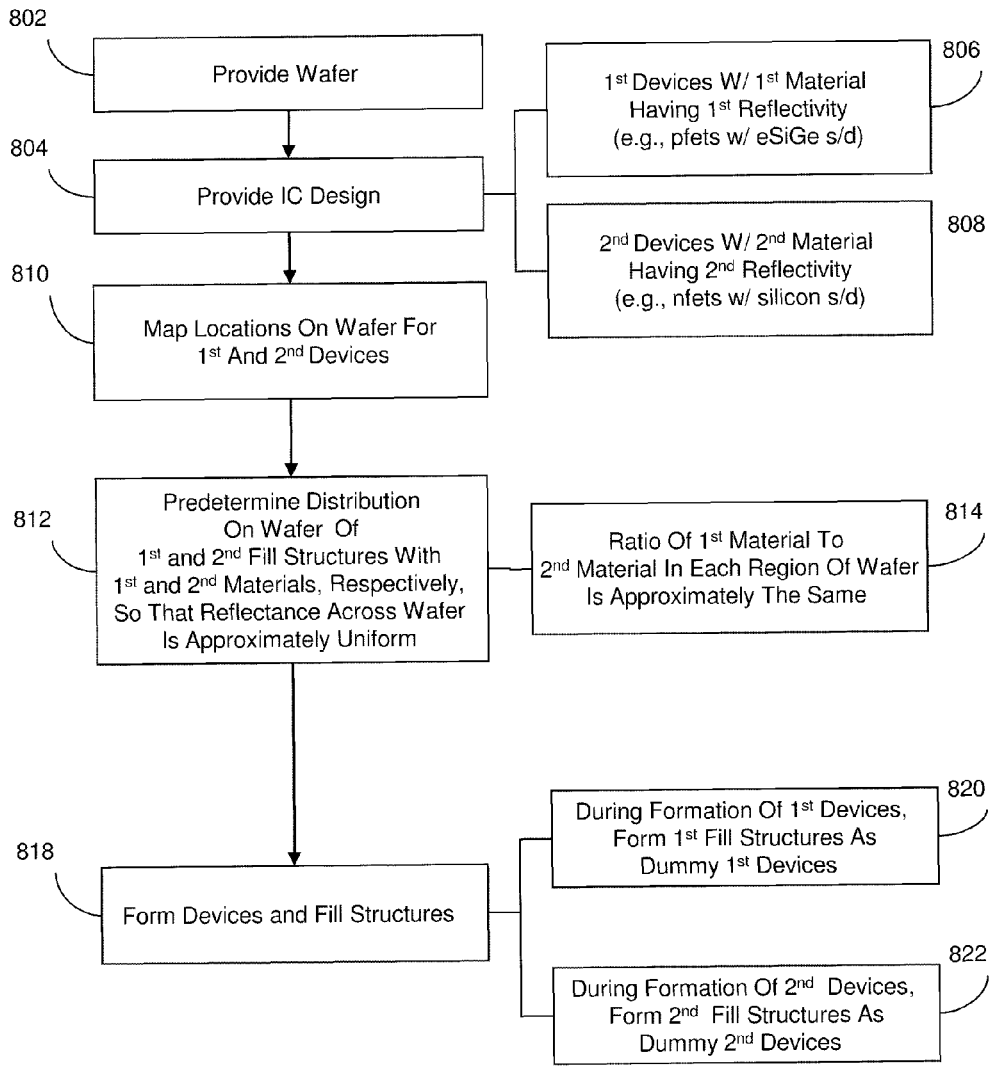
FIG. 8 is a flow diagram illustrating an embodiment of the method of the invention.

Referring to FIG. 8 in combination with FIG. 4, in one embodiment of the method of the invention a wafer is provided as is a design for an integrated circuit that is to be formed on the wafer (802-804).

The integrated circuit design can comprise multiple circuits (e.g., static random access memories (SRAMs) and logic circuits) and each these multiple circuits can comprise, for example, complementary metal oxide semiconductor (CMOS) devices incorporate both first type devices 410 (e.g., p-type field effect transistors (pfets)) with a first material having a first reflectivity (e.g., epitaxially grown silicon germanium) and second type devices 402 (e.g., n-type field effect transistors (nfets)) with a second material having a second reflectivity (e.g., single crystalline silicon) (806-808).

Based on the integrated circuit design, first devices 401 and second devices 402 that will form the circuits are mapped onto the wafer (810). Then, based on the mapping of the first and second devices 401-402, the distribution (i.e., quantity and locations) of fill structures 450 (i.e., first and second fill structures 451, 452) from region to region on the wafer as well as from sub-region to sub-region within each region is predetermined so that reflectance across the wafer will be approximately uniform (i.e., so that reflectance and absorption characteristics are balanced, so that reflectance and absorption characteristics are approximately equal, etc.) (812).

More specifically, approximately uniform reflectance can be achieved by distributing the fill structures 450 so that each region 410, 420 of the wafer and, optimally, each sub-region within each region (e.g., sub-regions 411-412 of region 410, sub-regions 421-422 of region 420, etc.) has approximately the same overall ratio and density of different materials having different reflectivities (814). That is, distribution of the fill structures 451 and 452 is predetermined so that each region 410, 420 and, optimally, each sub-region will have approximately the same overall ratio between the sum of the surface area of the first material in the first devices 401 and first fill structures 451 to the sum of the surface area of the second material in the second devices 402 and second fill structures 452. This same overall ratio can be predetermined and can, for example, be based on a ratio of all of the first devices 401 on the wafer to all of the second devices 402 on the wafer. Thus, for illustration purposes only, if the wafer design includes one hundred first devices and three hundred second devices, the predetermined ratio of first to second materials for each region 410, 420 should be approximately 1:3. However, since the ratio of first devices to second devices as well as their locations within any given region and/or within any given sub-region of the wafer will vary depending upon the design, the distribution (i.e., quantities and locations) of the first and second fill structures 451, 452 that is necessary to achieve uniform reflectance will also vary.

Once the circuit is mapped and the locations and quantities of the fill structures 450 are predetermined, the first and second devices 401, 402 and first and second fill structures 451-452 are simultaneously formed on the wafer (818). The first and second devices 401, 402 can be formed, for example, using conventional processing techniques for forming, on the same wafer, pfets with epitaxially grown silicon germanium source and drain regions and nfets with single crystalline silicon source and drain regions. Additionally, as the first devices 401 are formed, the first fill structures 451 can be formed, for example, by forming dummy first devices (i.e., non-functional devices) that are structured in the same manner as the first devices such that they comprise the same first material as the first devices (e.g., espitaxially grown silicon germanium source/drain regions) (820). Similarly, as the second devices 402 are formed, the second fill structures 452 can be formed, for example, by forming dummy second devices (i.e., non-functional devices) that are structured in the same manner as the second devices such that they comprise the same second material as the second devices (e.g., single crystalline silicon) (822).

Figure 9:
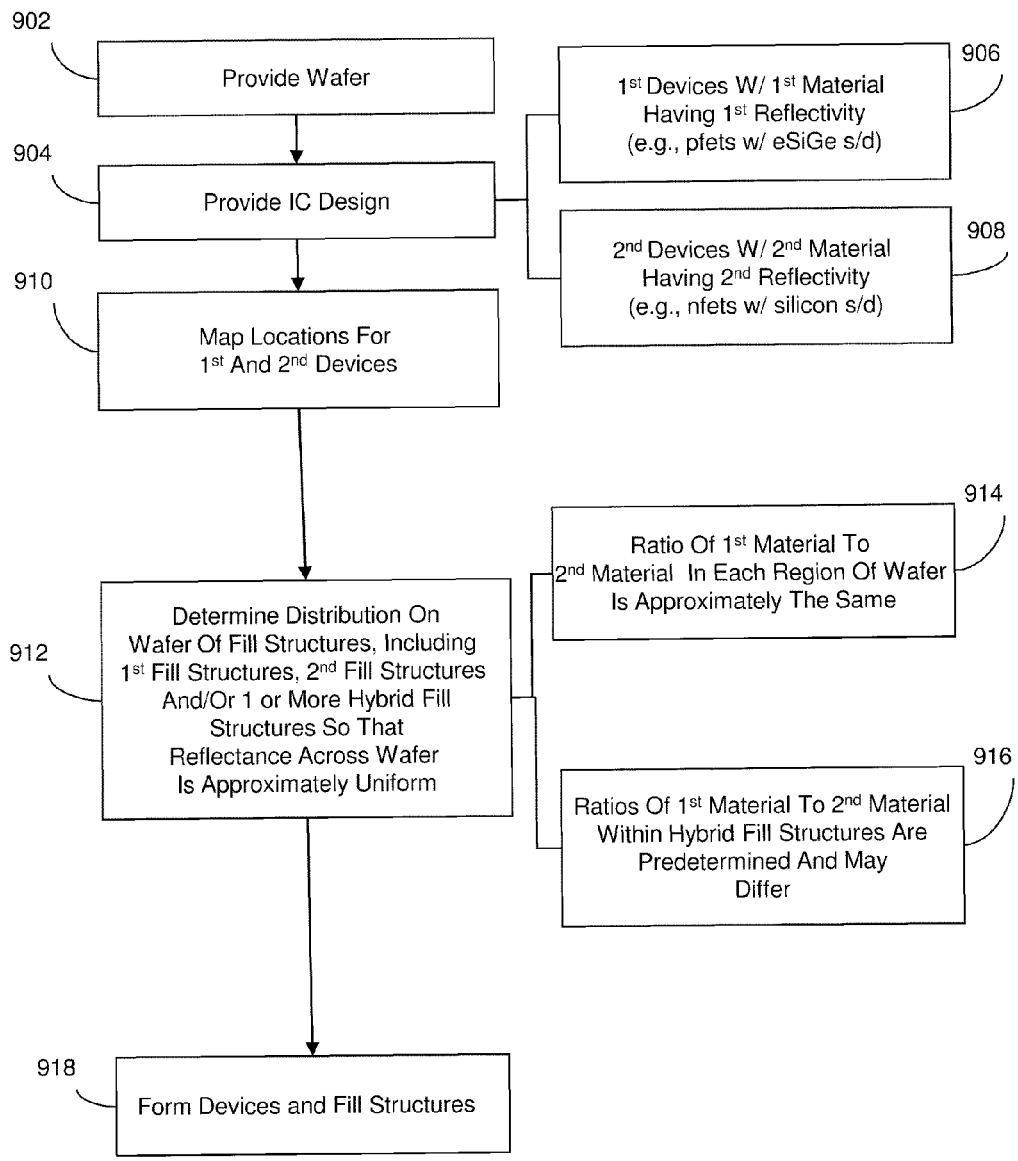
FIG. 9 is a flow diagram illustrating another embodiment of the method of the invention.

Referring to FIG. 9 in combination with FIG. 5, another embodiment of the method similarly comprises providing a wafer and a design for an integrated circuit that is to be formed on the wafer (902-904). The integrated circuit design can comprise multiple circuits e.g., static random access memories (SRAMs) and logic circuits and each of these multiple circuits can comprise, for example, complementary metal oxide semiconductor (CMOS) devices that incorporate both first type devices 501 (e.g., p-type field effect transistors (pfets)) with a first material having a first reflectivity (e.g., epitaxially grown silicon germanium) and second type devices 502 (e.g., n-type field effect transistors (nfets)) with a second material having a second reflectivity (e.g., single crystalline silicon) (806-808).

Based on the integrated circuit design, the first devices 501 and second devices 502 that will form the various circuits are mapped onto the wafer (910). Then, based on the mapping of the first and second devices 501-502, fill structure composition and distribution (i.e., quantity and locations) from region to region on the wafer and from sub-region to sub-region within each region is predetermined so that reflectance across the wafer will be approximately uniform (i.e., so that reflectance and absorption characteristics are balanced, so that reflectance and absorption characteristics are approximately equal, etc.) (912-916). The fill structures can comprises first fill structures 556 comprising the first material, second fill structures 557 comprising the second material, and/or one or more hybrid fill structures 550 comprising both materials. Thus, determining fill structure composition and distribution comprises determining the distribution (i.e., quantity and locations) of first fill structures, determining the distribution (i.e., quantity and locations) of second fill structures and determining the distribution (i.e., quantity and locations) of different hybrid fill structures with different predetermined ratios of the first to second material (e.g., see hybrid fills tructures 551-553).

More specifically, to achieve approximately uniform reflectance, the configuration and distribution of the fill structures (including any hybrid fill structures 550) relative to the first and second devices 501, 502 is predetermined so that each region 510, 520 of the wafer and, optimally, each sub-region within each region (e.g., sub-regions 511-513 of region 510, sub-regions 521-523 of region 520, etc.) will have approximately the same overall ratio and density of different materials having different reflectivities. That is, the configuration and distribution of the fill structures is predetermined so that each region 510, 520 and, optimally, each sub-region will have approximately the same overall ratio between the sum of the surface area of the first material in the first devices 501, the surface area of the first material in any first fill structures 556 and the surface area of the first material in any hybrid fill structures 550 to the sum of the surface area of the second material in the second devices 502, the surface area of the second material in any second fill structures 557 and the surface area of the second material in any hybrid fill structures 550.

As with the previously described embodiment, this same overall ratio can be predetermined and can, for example, be based on a ratio of all of the first devices 501 on the wafer to all of the second devices 502 on the wafer. Thus, for illustration purposes only, if the wafer design includes one hundred first devices and three hundred second devices, the predetermined ratio of first to second materials for each region 510, 520 should be approximately 1:3. However, since the ratio of first to second devices as well as their locations within any given region and/or within any given sub-region of the wafer will vary depending upon the design, the distribution of fill structures (i.e., the quantity and locations of the fill structures, including any hybrid fill structures 550) that is necessary to achieve uniform reflectance will be varied from region to region and sub-region to sub-region as will the ratio of first to second materials within the hybrid structures 550.

For example, regions 510 and 520 each illustrate an approximately 1:3 ratio of first to second materials (i.e., the ratio of the sum of the surface area of the first material in the first devices 510, the surface area of the first material in any first fill structures 556 and the surface area of the first material in any hybrid fill structures 550 to the sum of the surface area of the second material in the second devices 502, the surface area of the second material in any second fill structures 557 and the surface area of the second material in any hybrid fill structures 550). However, because the circuits in sub-regions 511-512 of the region 510 and the circuits in sub-regions 521-522 of region 520 are different (i.e., they contain different numbers and/or configurations of first and second devices 501, 502), the distribution of the fill structures, including any hybrid fill structure 550, as well as the ratio of first to second materials within any of the hybrid fill structures 550 may be varied.

For example, in less dense sub-regions (e.g., sub-regions 513 of region 510 and 523 of region 520) or in sub-regions already exhibiting the predetermined ratio of first to second materials (e.g., sub-region 511 of region 520), a first hybrid fill structure 551 that comprises the same ratio of first to second materials as the predetermined ratio for each region (e.g., 1:3) and/or first and second fill structures 556, 557 in the same ratio can be formed. However, in sub-regions in which the ratio of first to second devices is greater than or less than the predetermined ratio for each region, additional hybrid fill structures (e.g. 552-553), first fill structures 556 and/or second fill structures 557 can be used. For example, in sub-region 512 of region 510 a greater ratio of first to second devices can be balanced by second hybrid fill structures 552 having a greater amount of the second material proportionally as compared to the first hybrid fill structures 551. Alternatively, in sub-regions 521-522 of region 520 a lesser ratio of first to second devices can be balanced by third hybrid fill structures 553 having a lesser amount of the second material proportionally than the first hybrid fill structures 551.

Once the circuit is mapped and the locations and quantities of fill structures, including any hybrid fill structure 551-553, are predetermined, the first and second devices 501, 502 and hybrid fill structures 551-553 can simultaneously be formed on the wafer (918). As with the previously described embodiment, the first and second devices 601, 602 can be formed using conventional processing techniques for forming, on the same wafer, pfets with epitaxially grown silicon germanium source and drain regions and nfets with single crystalline silicon source and drain regions. On the hybrid structure 550 only a portion of the structure is replaced by epitaxially grown silicon germanium.

Figure 10:
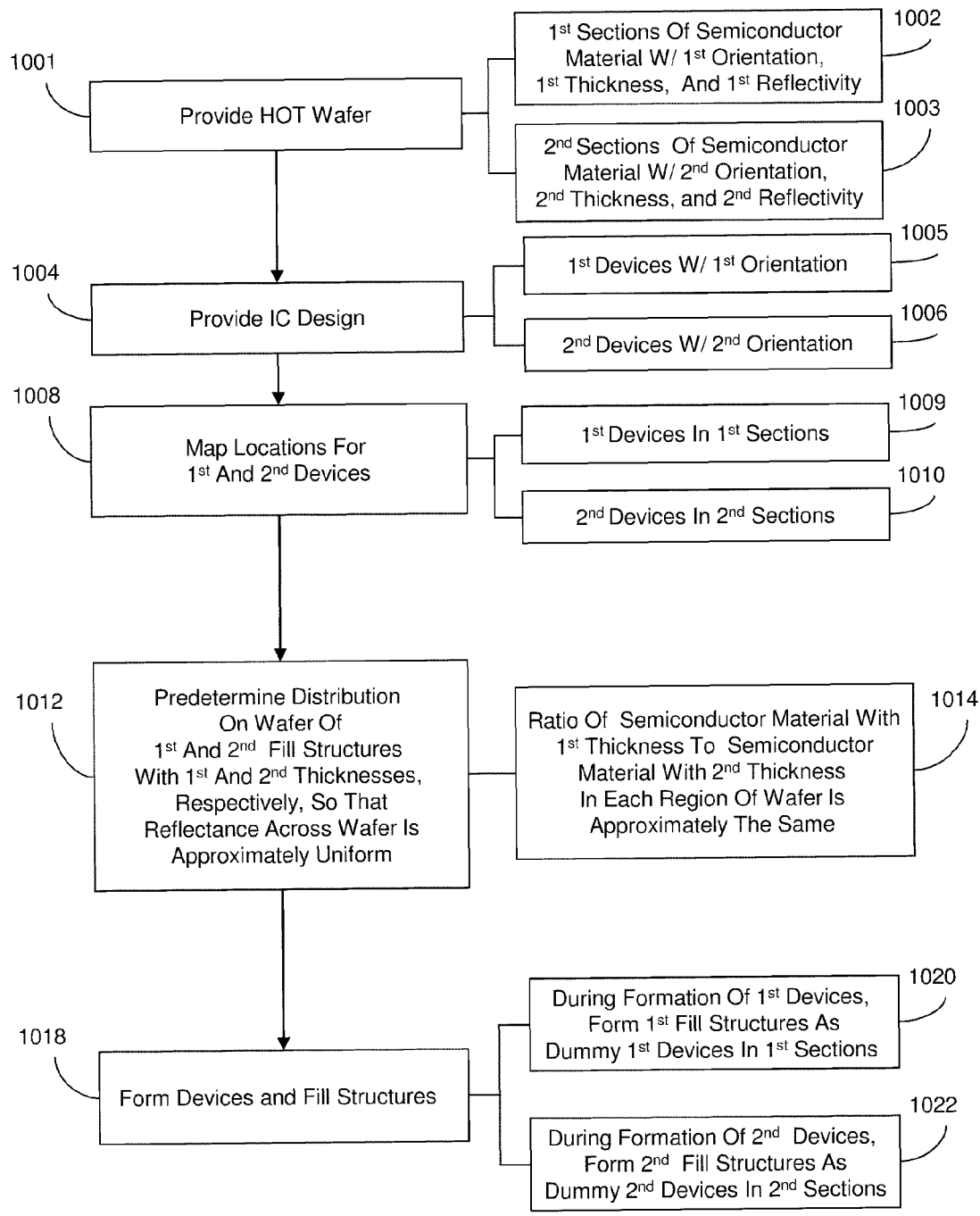
FIG. 10 is a flow diagram illustrating yet another embodiment of the method of the invention.

Referring to FIG. 10 in combination with FIGS. 6 and 7, yet another embodiment of the method comprises providing a hybrid orientation (HOT) wafer and a design for an integrated circuit that is to be formed on the wafer (1001-1006).

Specifically, referring to FIG. 7, the HOT wafer can be formed, for example, by depositing a dielectric layer 780 on a semiconductor substrate 700 and depositing a semiconductor layer on the dielectric layer. The semiconductor layer should be selected so that it has a different crystalline orientation than the semiconductor substrate. Trenches can be patterned into the semiconductor and dielectric layers down to the semiconductor substrate, thus, forming sections of the semiconductor material having a first orientation (e.g., first sections 751). Then, the same semiconductor material can be epitaxially grown on the substrate in the trenches such that it has the same orientation as the substrate, thus, forming additional sections of the semiconductor material with a second orientation (e.g., second sections 752). The first sections 751 can, for example, comprise 110 orientation single crystalline silicon that is optimal for pfet performance and the second sections 752 can, for example, comprise 100 orientation single crystalline silicon that is optimal for nfet performance. Due to the processes used to form the first and second sections 751, 752, they will have different thicknesses. That is, a first thickness 761 of the first sections 751 of semiconductor material with the first crystalline orientation will be less than a second thickness 762 of the second sections 752 of semiconductor material with the second crystalline orientation. Consequently, the first and second sections 751, 752 will have different reflectance and absorption characteristics (i.e., a first reflectivity and a second reflectivity, respectively) (1001-1003).

The integrated circuit design can comprise multiple circuits (e.g., static random access memories (SRAMs) and logic circuits) and each of these multiple circuits can comprise, for example, complementary metal oxide semiconductor (CMOS) devices that incorporate both first type devices 601 (e.g., p-type field effect transistors (pfets)) and second type devices 602 (e.g., n-type field effect transistors (nfets)) (904-906, see FIG. 2).

Based on the integrated circuit design and the configuration of the HOT wafer, first devices 601 and second devices 602 are mapped onto the wafer (1008). Specifically, the first and second devices 601, 602 are mapped so that they will be formed in the first and second sections 751, 752, respectively, to ensure optimal performance (1009-1010). For example, if the first silicon sections 751 are 110 orientation and the first devices 601 are pfets, the first devices 601 will be formed in the first sections 751 to ensure optimal performance (1009). Similarly, if the second silicon sections 752 are 100 orientation and the second devices 602 are nfets, the second devices 602 will be formed in the second sections 752 to ensure optimal performance (1010).

Then, based on the mapping of the first and second devices 601-602, the distribution (i.e., quantity and locations) of fill structures 650 (i.e., first and second fill structures 651, 652) from region to region on the wafer as well as from sub-region to sub-region within each region is predetermined so that reflectance across the wafer will be approximately uniform (i.e., so that reflectance and absorption characteristics are balanced, so that reflectance and absorption characteristics are approximately equal, etc.) (1012). More specifically, approximately uniform reflectance can be achieved when each region 610, 620 of the wafer and, optimally, when any given sub-region within each region (e.g., sub-regions 611-612 of region 610, sub-regions 621-622 of region 620, etc.) has approximately the same overall ratio and density of semiconductor material with a first thickness and first reflectivity to semiconductor material with a second thickness and second reflectivity (814). That is, distribution of the fill structures 651 and 652 is predetermined so that each region 610, 620 and, optimally, each sub-region will have approximately the same overall ratio between the sum of the surface area of the semiconductor material with the first thickness 761 in the first devices 601 and first fill structures 651 to the sum of the surface area of the semiconductor material with the second thickness 762 in the second devices 602 and second fill structures 652. This same overall ratio can be predetermined and can, for example, be based on a ratio of all of the first devices 601 on the wafer to all of the second devices 602 on the wafer. Thus, for illustration purposes only, if the wafer design includes one hundred first devices and three hundred second devices, the predetermined ratio for each region 610, 620 should be approximately 1:3. However, since the ratio of first devices to second devices as well as their locations within any given region and/or within any given sub-region of the wafer will vary depending upon the design, the distribution (i.e., quantities and locations) of the first and second fill structures 651, 652 that is necessary to achieve uniform reflectance will also vary.

Once the circuit is mapped and the locations and quantities of the fill structures 650 are predetermined, the first and second devices 601, 602 and first and second fill structures 651-652 are simultaneously formed on the wafer (818). The first and second devices 601, 602 can be formed, for example, using conventional processing techniques for forming, on the same HOT wafer, pfets with in a first section with a first orientation (e.g., 110) silicon and nfets in a second section with a second orientation (e.g., 100) silicon. Additionally, as the first devices 401 are formed, the first fill structures 651 can be formed, for example, by forming dummy first devices (i.e., non-functional devices) that are structured in the same manner and formed in the same first sections on the wafer as the first devices 601 such that they comprise the same orientation silicon with the same thickness (1020). Similarly, as the second devices 602 are formed, the second fill structures 652 can be formed, for example, by forming dummy second devices (i.e., non-functional devices) that are structured in the same manner and in the same second sections on the wafer as the second devices 602 such that they comprise the same orientation silicon with the same thickness (1022).

Therefore, disclosed above are embodiments of a semiconductor structure and associated methods of forming the structure that use dummy fill structures with varying configurations to provide uniform reflectance across a wafer in order to ensure uniform temperatures changes across the wafer during a rapid thermal anneal. One embodiment achieves uniform reflectance by distributing across the wafer fill structures that comprise different semiconductor materials such that approximately the same overall ratio and density between the different semiconductor materials is achieved within each region and, optimally, within each sub-region of the wafer. Another achieves uniform reflectance by distributing across the wafer fill structures, including one or more hybrid fill structure containing varying proportions of different semiconductor materials, such that approximately the same overall ratio and density between the different semiconductor materials is achieved within each region and, optimally, within each sub-region of the wafer. Yet another achieves uniform reflectance by distributing across the wafer fill structures that comprise semiconductor materials with different thicknesses such that approximately the same overall ratio and density between the semiconductor material with the different thicknesses is achieved within each region and, optimally, within each sub-region of the wafer.

It should be noted that the inventors of the above embodiments have invented the following additional inventions related to the reflectance and absorption characteristics of wafers during rapid thermal anneals, each of which is being filed simultaneously herewith and is fully incorporated herein by reference: (1) co-filed U.S. patent application Ser. No. 11/678,783, titled "Localized Temperature Control During Rapid Thermal Anneal", (2) co-filed U.S. patent application Ser. No. 11/678,756, titled "Semiconductor Wafer Structure With Balanced Reflectance And Absorption Characteristics For Rapid Thermal Anneal Uniformity", and (3) co-filed U.S. patent application Ser. No. 11/678,799, titled "Localized Temperature Control During Rapid Thermal Anneal", The foregoing description of the specific embodiments will so fully reveal the general nature of the invention that others can, by applying current knowledge, readily modify and/or adapi for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A semiconductor structure comprising:
   a wafer;
   a plurality of first devices on said wafer,
   wherein said first devices comprise a first material, having a first reflectivity;
   a plurality of second devices on said wafer,
   wherein said second devices comprise a second material, having a second reflectivity, and wherein said first reflectivity is different from said second reflectivity;
   a plurality of fill structures comprising at least one hybrid fill structure, wherein said at least one hybrid fill structure comprises both said first material and said second material, and wherein distribution of said fill structures across said wafer relative to said first devices and said second devices is such that reflectance across said wafer is approximately uniform.

2. The semiconductor structure of claim 1,
   wherein said wafer comprises multiple regions, and
   wherein said distribution of said fill structures relative to said first devices and said second devices in each of said regions is predetermined so that each of said regions has approximately the same ratio of said first material to said second material.

3. The semiconductor structure of claim 2, wherein different regions of said wafer have different ratios of said first devices to said second devices and, therefore, have different distributions of said fill structures.

4. The semiconductor structure of claim 3, wherein different sub-regions within at least one of said regions have different ratios of said first devices to said second devices and, therefore, have different distributions of said fill structures.

5. The semiconductor structure of claim 1, wherein said at least one hybrid fill structure comprises a predetermined ratio of said first material to said second material.

6. The semiconductor structure of claim 5, wherein said plurality of fill structures further comprises multiple hybrid fill structures comprising predetermined ratios of said first material to said second material.

7. The semiconductor structure of claim 6, wherein said predetermined ratios of said first material to said second material of said hybrid fill structures differ.

8. The semiconductor structure of claim 1,
wherein said first material comprises silicon germanium, and
wherein said second material comprises silicon.

9. A method of forming a semiconductor structure comprising:
forming, on a wafer, first devices comprising a first material with a first reflectivity and second devices comprising a second material with a second reflectivity that is different from said first reflectivity; and
forming, on said wafer, a plurality of fill structures comprising said first material and said second material, wherein said forming of said fill structures comprises forming at least one hybrid fill structure comprising both said first material and said second material, and
wherein said forming of said fill structures comprises distributing said fill structures across said wafer relative to said first devices and said second devices such that reflectance across said wafer is approximately uniform.

10. The method of claim 9, further comprising before said forming of said first devices, said second devices and said fill structures, mapping each of said first devices and said second devices onto said wafer based on a design.

11. The method of claim 10, wherein said forming of said plurality of fill structures comprises forming first fill structures comprising said first material and second fill structures comprising said second material.

12. The method of claim 11, further comprising, determining, based on said mapping, quantities and locations of said first fill structures and said second fill structures so that each region of said wafer has approximately the same ratio of said first material to said second material.

13. The method of claim 11,
wherein said forming of said first fill structures comprises during said forming of said first devices, forming non-functional first devices, and
wherein said forming of said second fill structures comprises, during said forming of said second devices, forming non-functional second devices.

14. The method of claim 11,
wherein said first material comprises epitaxially grown silicon germanium, and
wherein said second material comprises single crystal silicon.

15. The method of claim 10, further comprising, determining, based on said mapping, a location and a first material to second material ratio for said at least one hybrid fill structure.

16. The method of claim 9, wherein said forming of said plurality of fill structures comprises forming multiple hybrid fill structures having different predetermined first material to second material ratios, and wherein said different predetermined first material to second material ratios of said multiple hybrid fill structures ensure that each region of said wafer has approximately the same ratio of said first material to said second material.

17. A method of forming a semiconductor structure, said method comprising:
forming, on a wafer, first devices comprising a semiconductor material with a first thickness such that said first devices have a first reflectivity and second devices comprising said semiconductor material with a second thickness different from said first thickness such that said second devices have a second reflectivity different from said first reflectivity; and
forming, on said wafer, first fill structures comprising said semiconductor material with said first thickness and second fill structures comprising said semiconductor material with said second thickness, wherein said forming of said first fill structures and said second fill structures comprises:
forming said first fill structures and said second fill structures as non-functioning devices positioned laterally relative to said first devices and said second devices and such that said first fill structures comprise said semiconductor material with said first thickness and said first reflectivity and said second fill structures comprise said semiconductor material with said second thickness and said second reflectivity; and
distributing said first fill structures and said second fill structures across said wafer relative to said first devices and said second devices such that reflectance across said wafer is approximately uniform.

18. The method of claim 17, wherein said providing of said wafer comprises providing a hybrid orientation wafer comprising first silicon sections having said first thickness and a first orientation and second silicon sections having said second thickness and a second orientation.

19. The method of claim 18,
wherein said forming of said first devices and said forming of said first fill structures comprise simultaneously forming said first devices and said first fill structures in said first silicon sections, and
wherein said forming of said second devices and said forming of said second fill structures comprises simultaneously forming said second devices and said second fill structures in said second silicon sections.

20. The method of claim 17, wherein said forming of said first fill structures further comprises forming non-functional first devices and wherein said forming of said second fill structures comprises forming non-functional second devices.

21. The method of claim 17, further comprising before said forming of said devices and said fill structures,
mapping each of said first devices and said second devices onto said wafer based on a design; and
based on said mapping, determining quantities and locations of said first fill structures and said second fill structures so that each region of said wafer has approximately the same ratio of said semiconductor material with said first thickness to said semiconductor material with said second thickness.

* * * * *